(12) United States Patent
Liu

(10) Patent No.: US 12,378,664 B2
(45) Date of Patent: Aug. 5, 2025

(54) METAL SURFACE LAYER TREATING METHOD, METAL ASSEMBLY AND ELECTRONIC DEVICE

(71) Applicant: Beijing Xiaomi Mobile Software Co., Ltd., Beijing (CN)

(72) Inventor: Bing Liu, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 569 days.

(21) Appl. No.: 17/703,385

(22) Filed: Mar. 24, 2022

(65) Prior Publication Data

US 2023/0097354 A1 Mar. 30, 2023

(30) Foreign Application Priority Data

Sep. 27, 2021 (CN) .......................... 202111138545.5

(51) Int. Cl.
| | | |
|---|---|---|
| *C23C 14/34* | (2006.01) | |
| *C23C 14/06* | (2006.01) | |
| *C23C 14/58* | (2006.01) | |
| *C23C 16/36* | (2006.01) | |
| *C23C 16/50* | (2006.01) | |
| *C23C 16/56* | (2006.01) | |
| *G04B 37/22* | (2006.01) | |
| *G04G 17/08* | (2006.01) | |

(52) U.S. Cl.
CPC .............. *C23C 16/36* (2013.01); *C23C 16/50* (2013.01); *C23C 16/56* (2013.01); *G04B 37/223* (2013.01); *G04G 17/08* (2013.01)

(58) Field of Classification Search
None
See application file for complete search history.

(56) References Cited

FOREIGN PATENT DOCUMENTS

| | | | |
|---|---|---|---|
| CN | 101289735 A | * | 10/2008 |
| CN | 105839046 A | | 8/2016 |
| CN | 108070817 A | | 5/2018 |
| CN | 109983147 A | | 7/2019 |
| CN | 111270198 A | | 6/2020 |
| GB | 2261227 B | | 1/1995 |
| JP | 2005-097651 A | | 4/2005 |
| JP | 2007016273 A | | 1/2007 |

* cited by examiner

*Primary Examiner* — Anthony M Liang
(74) *Attorney, Agent, or Firm* — Volpe Koenig

(57) ABSTRACT

The disclosure provides a metal surface layer treating method, a metal assembly and an electronic device. The metal surface layer treating method includes: putting metal into a vacuum chamber, and vacuumizing the vacuum chamber to a first vacuum degree; adding a mixed gas of acetylene, nitrogen and hydrogen into the vacuum chamber; and heating the vacuum chamber to a temperature above an ambient temperature. In response to the temperature in the vacuum chamber reaching a first temperature value above the ambient temperature and a gas pressure of the vacuum chamber reaching a first pressure value, performing glow discharge so that a carbon-nitrogen gradient hardening layer is formed on a surface layer of the metal. The method includes removing part of a carbon layer of the surface layer of the carbon-nitrogen gradient hardening layer.

8 Claims, 5 Drawing Sheets

METAL SURFACE LAYER TREATING METHOD, METAL ASSEMBLY AND ELECTRONIC DEVICE

CROSS REFERENCE TO RELATED APPLICATIONS

The present application claims the benefit of priority to Chinese Patent Application No. 202111138545.5 filed on Sep. 27, 2021, the contents of which are incorporated herein by reference in their entireties for all purposes.

BACKGROUND

At present, electronic devices such as smart phones, smart tablets, smart watches or smart bracelets have become indispensable technological products in everyday life. These electronic devices are used for both learning and entertainment, bringing a lot of convenience and fun to peoples' lives.

SUMMARY

The disclosure relates to the technical field of electronics, in particular to a metal surface layer treating method, a metal assembly and an electronic device. The disclosure provides a metal surface layer treating method, a metal assembly and an electronic device.

In a first aspect of an example of the disclosure, a metal surface layer treating method is provided. The method includes: putting metal into a vacuum chamber; creating a vacuum in the vacuum chamber to a first vacuum degree; adding a mixed gas of acetylene, nitrogen and hydrogen into the vacuum chamber; and elevating an ambient temperature in the vacuum chamber. In response to the ambient temperature in the vacuum chamber reaching a first temperature value and a gas pressure of the vacuum chamber reaching a first pressure value, performing glow discharge so that a carbon-nitrogen gradient hardening layer is formed on a surface layer of the metal. Part of a carbon layer of the surface layer of the carbon-nitrogen gradient hardening layer is then removed.

According to a second aspect of an example of the disclosure, a metal assembly is provided. The metal assembly includes a metal body and a carbon-nitrogen gradient hardening layer covering the metal body. A hardness of the carbon-nitrogen gradient hardening layer is gradually reduced in a direction from an outside surface to an inside surface thereof.

According to a third aspect of an example of the disclosure, an electronic device is further provided. The electronic device includes a metal assembly. The metal assembly includes a metal body and a carbon-nitrogen gradient hardening layer covering the metal body. A hardness of the carbon-nitrogen gradient hardening layer is gradually reduced in a direction from an outside surface to an inside surface thereof.

It should be understood that the above general descriptions and the following detailed descriptions are exemplary and explanatory only and are not intended to limit the disclosure.

BRIEF DESCRIPTION OF THE DRAWINGS

The accompanying drawings, which constitute a part of the disclosure, are used to provide a further understanding of the disclosure. The drawings illustrate examples of the disclosure, which together with the descriptions herein are used to explain the disclosure. The examples illustrated in the drawings are not intended as limitations on the disclosure.

The drawings illustrate the examples of the disclosure described herein and the drawings will be briefly introduced below. The drawings introduced below are only some examples of the disclosure. Those ordinarily skilled in the art upon reading the disclosure herein and the accompanying drawings, will appreciate that many variations of the examples herein are possible and are within the purview of those of ordinary skill. These variations are within the scope of the disclosure.

DETAILED DESCRIPTION

Figure 1:
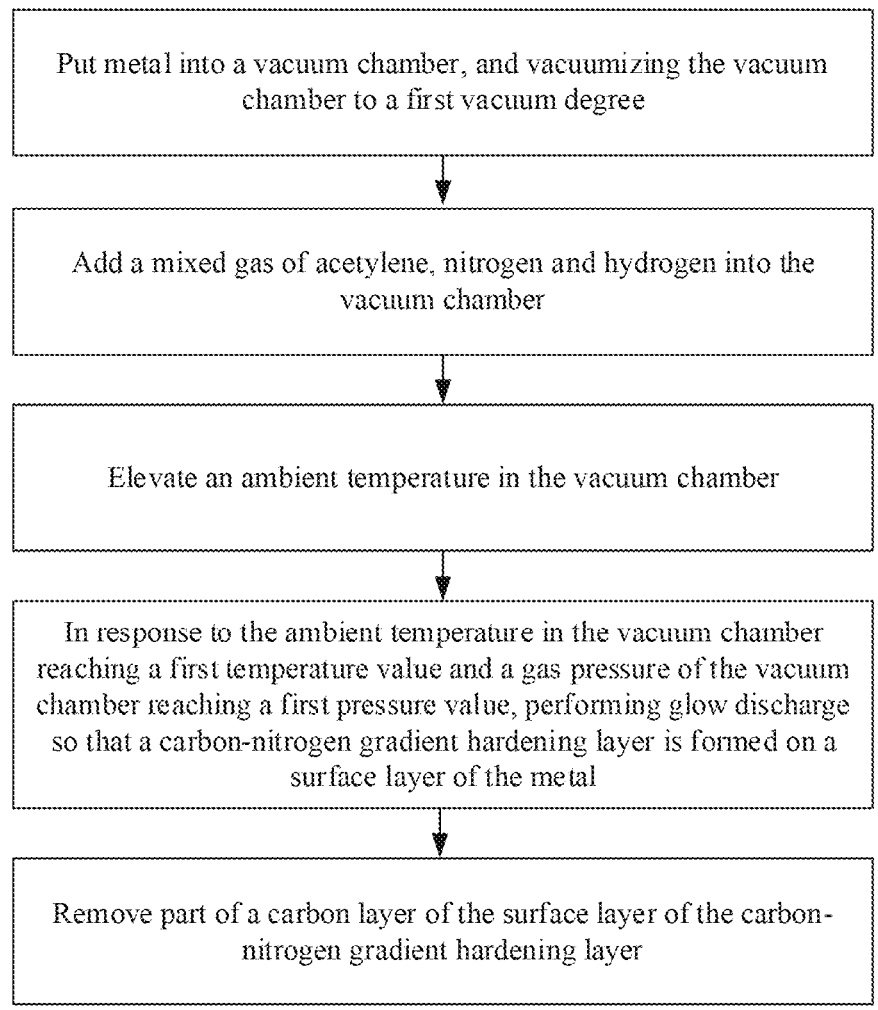
FIG. 1 is a flow diagram of a metal surface layer treating method shown in an example.

In order to clarify the objectives, technical solutions, and advantages of the disclosure, the disclosure will be described in further detail below with reference to the accompanying drawings and with description of specific embodiments. It should be understood that the specific embodiments described herein are only used to explain the disclosure, and are not intended to limit the scope of protection accorded to the disclosure.

The following reference numerals are used herein: 10, Electronic device; 100, Metal assembly; 110, Metal body; and 120, Carbon-nitrogen gradient hardening layer.

For the convenience of understanding, technical terms involved in examples of the disclosure will be explained and described first below.

The term 'Glow Discharge' refers to a phenomenon of gas discharge showing glow in low-pressure gas, that is, the phenomenon of self-sustained discharge (self-excited conduction) in rarefied gas. Glow discharge includes two transition stages: subnormal glow and abnormal glow. The basic approach to producing the glow discharge phenomenon is to place two parallel electrode plates in a closed container and then to use generated electrons to excite neutral atoms or molecules. The excited particles will release energy in a form of light when dropping from an excited state back to a ground state.

The term 'Volume strength' (VOL) refers to a physical unit, which is a percentage of a volume of a certain specific gas in the total volume of a mixed gas.

The term 'Hardness according to Vickers' (HV) refers to a Vickers hardness.

The term 'Gram force' (gf) refers to a unit of a magnitude of the gravitational force that a substance with a mass of 1 g is subjected to, which is read as: 1 gram force (gf).

It should be noted that all technical and scientific terms used herein have the same meaning as commonly understood by those skilled in the technical field of the disclosure. The terms used in this specification are only for the purposes of describing the specific embodiments, and are not intended to limit the disclosure, but instead should be construed broadly and in an open-ended manner.

At present, electronic devices such as smart phones, smart tablet PCs, smart watches or smart bracelets have become indispensable technological products in everyday life. These devices are used for learning as well as entertainment. They bring convenience and fun to peoples' lives. With the diversification and development of electronic device functions, there are many types and brands of electronic devices becoming available. Consumers can choose from a wide variety of electronic devices. Consumers demand not only improved functional characteristics in their electronic devices, but also aesthetics in housing structures of the electronic devices. Aesthetics has become an important factor affecting the competitiveness of electronic products. Among electronic devices with similar functions or performance capabilities, the more beautiful the appearance of an electronic device, the more attractive the electronic device is to the consumer when it comes to consumer purchases.

In the related art, the surfaces of metal housings in which electronic devices such as smart phones, smart watches or smart bracelet PCs are disposed, are usually subjected to surface treatments such as polishing, sandblasting or wire drawing to enhance the aesthetics. Usually, a physical vapor deposition (PVD) method is used to improve the scratch resistance of the metal surface. A hardness of the metal itself is 120 HV to 260 HV. A hardness of a physical vapor deposition layer deposited on the metal surface is usually 400 HV to 600 HV.

If the hardness of the physical vapor deposition layer is too high, the bonding force between the physical vapor deposition layer and the metal housing will be poor, that is, the adhesive force will be poor. As a result, the hardness of the physical vapor deposition layer of the metal housing applied to the electronic devices such as smart phones, smart watches or smart bracelet PCs is low, which leads to surfaces that are easily scratched. Scratches affect the aesthetic appearance of electronic devices. If the hardness of the physical vapor deposition layer is too high, the skin of the metal housing peels away easily, which is not conducive to maintaining the aesthetic appearance of the electronic device. In other words, it is challenging to achieve a sufficient hardening layer for a metal housing of a conventional electronic device, one that ensures the device has acceptable scratch resistance and also sufficient adhesion properties.

To meet these challenges a metal surface layer treating method is provided herein. Also provided herein is a metal assembly that can attach a reliable hardening layer to a metal surface so as to improve the scratch resistance and therefore maintain the aesthetic appearance of electronic devices. The metal surface layer treating method of the disclosure will be described below with reference to the accompanying drawings.

As shown in FIG. 1, in an example of the disclosure, a metal surface layer treating method is provided, including the following steps. First, metal is put into a vacuum chamber, and the vacuum chamber is vacuumized to a first vacuum degree. A mixture of acetylene, nitrogen and hydrogen gas is added into the vacuum chamber. An ambient temperature in the vacuum chamber is elevated.

In response to the ambient temperature in the vacuum chamber reaching a first temperature value and a gas pressure of the vacuum chamber reaching a first pressure value, glow discharge is performed so that a carbon-nitrogen gradient hardening layer is formed on a surface layer of the metal. Part of a carbon layer of the surface layer of the carbon-nitrogen gradient hardening layer is removed.

By using the metal surface layer treating method of the disclosure, a carbon-nitrogen gradient hardening layer having a hardness that is gradually reduced in a direction from an outside surface to an inside surface can be achieved. This results in an inner layer of the carbon-nitrogen gradient hardening layer having good adhesive force. The carbon-nitrogen gradient hardening layer can be reliably attached to a metal body. A surface layer of the carbon-nitrogen gradient hardening layer has high hardness. The carbon-nitrogen gradient hardening layer may be used to improve the hardness of the metal surface, so that the metal has better scratch resistance. The metal surface layer treating method may include attaching the reliable carbon-nitrogen gradient hardening layer on the metal surface to thereby improve the scratch resistance of the metal surface.

Figure 2:
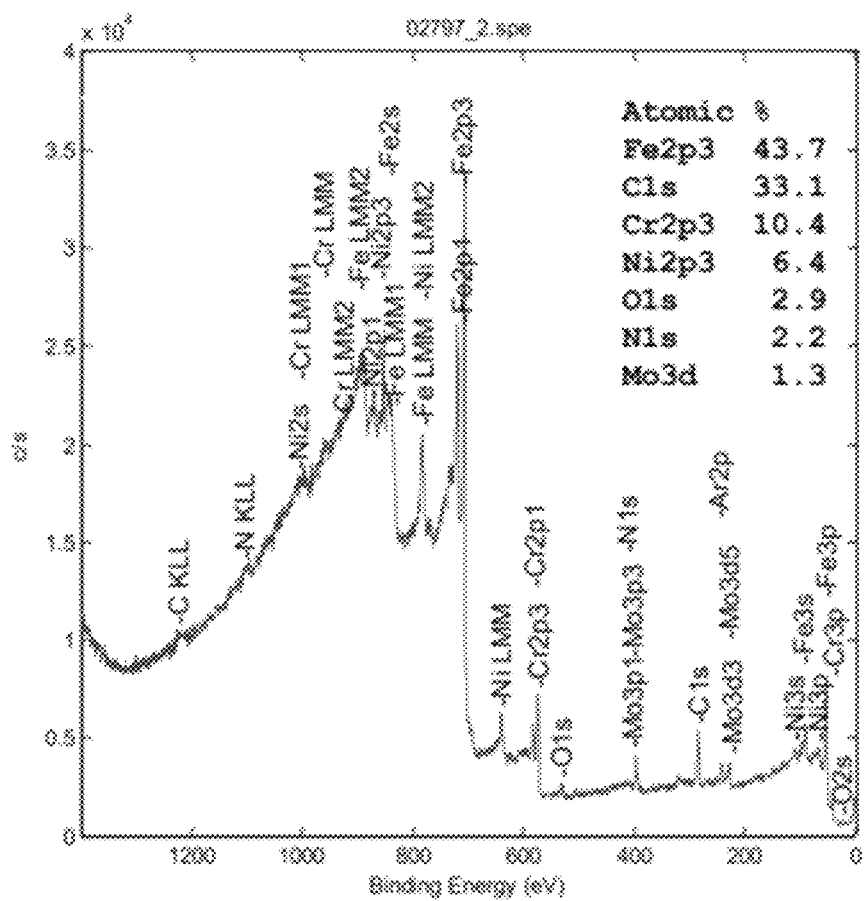
FIG. 2 is a diagram in which an XPS full spectrum of 10 nm thick is sputtered on a surface of a metal body shown in an example.

FIG. 2 shows an X-ray Photoelectron Spectroscopy (XPS) full spectrum distribution obtained by sputtering 10 nm on the surface of the metal body using the metal surface layer treating method. A carbon-nitrogen ratio of the carbon-nitrogen gradient hardening layer is given. Combined with fundamental principles of the low-temperature plasma infiltration design, such as Sievert's law and Fick's second law, a target carbon-nitrogen gradient hardening layer can be obtained according to the properties of the metal body so as to meet a given scratch resistance performance requirement.

In some examples, the first vacuum degree is in the range of 0.001 Pa to 10 Pa. The first temperature value is in the range of 400° C. to 450° C. The first pressure value is in the range of 100 Pa to 200 Pa. A voltage of the glow discharge is in the range of 600 V to 800 V and a continuous discharge time is in the range of 35 h to 40 h. In this way, a carbon-nitrogen gradient hardening layer with sufficient thickness can be formed on the surface layer of the metal body so as to maintain the adhesive force of the carbon-nitrogen gradient hardening layer, as well as obtaining a surface with higher hardness, and providing the metal body with a higher scratch resistance.

On the basis of any one of the above examples, in some examples of the mixed gas the hydrogen accounts for 80% VOL to 90% VOL, the acetylene accounts for 5% VOL to 10% VOL, and the nitrogen accounts for 5% VOL to 10% VOL. In this way the carbon-nitrogen ratio in the carbon-nitrogen gradient hardening layer is appropriate, so that a hardness gradient of the carbon-nitrogen gradient hardening layer changes reasonably. The resulting carbon-nitrogen gradient hardening layer can meet both the adhesive force requirement and the surface hardness requirement.

In some examples, in the mixed gas, the hydrogen accounts for 80% VOL, the acetylene accounts for 10% VOL, and the nitrogen accounts for 10% VOL. Alternatively, the hydrogen accounts for 90% VOL, the acetylene accounts for 5% VOL, and the nitrogen accounts for 5% VOL.

Figure 3:
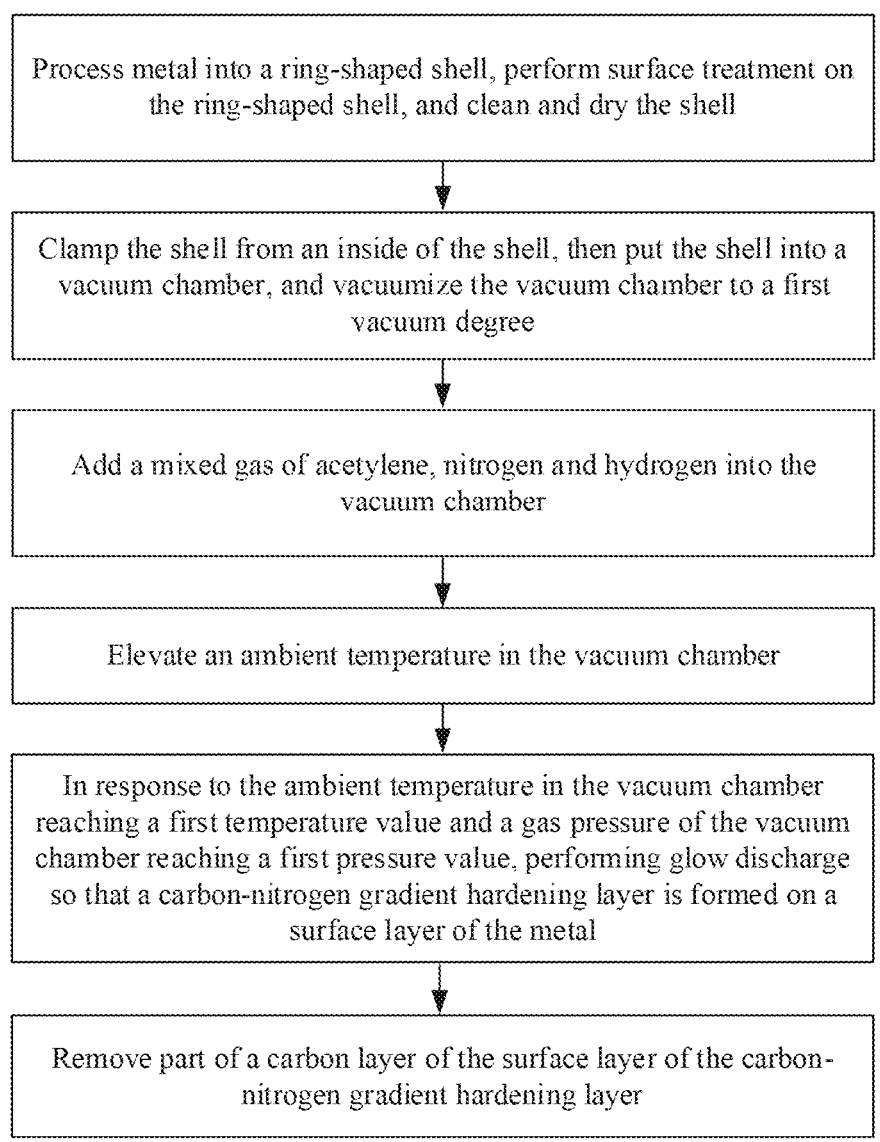
FIG. 3 is a flow diagram of a metal surface layer treating method shown in another example.

Examples based on any one of the above examples are shown in FIG. 3. In some examples, before the metal is put into the vacuum chamber, the method further includes the following steps. The metal is processed into a ring-shaped housing. The housing is clamped from inside of the housing. Then, the housing is placed into the vacuum chamber. In this way, the inside of the housing protects electrical components. The carbon-nitrogen gradient hardening layer in any one of the above examples is formed on the metal surface of the housing and has good adhesive force. Thus, at least part of the surface of an electronic device has better scratch resistance, which is conducive to maintaining the aesthetic appearance of the electronic device.

As shown in FIG. 3, in some examples, after the metal is processed into the housing the method further includes the following steps. Surface treatment is performed on the ring-shaped housing. Then the cleaned and dried metal is put into the vacuum chamber. In this way, the surface treatment (such as polishing, sandblasting, wire drawing or other machining surface treatment) of the ring-shaped housing can improve the aesthetics of the metal surface and can meet the individual preferences of different users. At the same time, by using the above metal surface layer treating method, a reliable carbon-nitrogen gradient hardening layer is formed on the surface of the metal body and this will provide good scratch resistance. This is conductive to maintaining the aesthetic appearance of the electronic device.

In some examples, the surface of the metal housings of electronic devices such as smart phones, smart watches or smart bracelet PCs is subjected to polishing, sandblasting, wire drawing or other surface treatment, so as to improve the aesthetics and meet individual preferences of different users.

In some examples, the metal is stainless steel. In these examples a carbon-nitrogen gradient hardening layer with a better hardness gradient change can be formed, so that the inner layer of the carbon-nitrogen gradient hardening layer can be more reliably attached to the metal body. The surface layer of the carbon-nitrogen gradient hardening layer has a higher hardness, the hardness of the metal surface can be further improved, and the metal has better scratch resistance.

In some examples, a thickness of a removed part of the carbon layer is in the range of 1 μm to 3 μm. In this way, the texture of the metal surface may be restored and at the same time, good scratch resistance is achieved.

In some examples, a method such as plasma polishing or electrolytic polishing or mechanical polishing or sand blasting may be used to remove thickness of 1 μm to 3 μm of the carbon layer on the surface layer of the carbon-nitrogen gradient hardening layer. For example, in an embodiment employing polishing to remove the carbon layer, after the metal is put into the vacuum chamber to obtain the carbon-nitrogen gradient hardening layer, a polishing process can be carried out to remove the carbon layer so as to keep the original texture of the metal body.

For example, in an embodiment in which sandblasting is performed to remove the carbon layer, after the metal is put into the vacuum chamber to obtain the carbon-nitrogen gradient hardening layer, the sandblasting process can be carried out to remove the carbon layer, so as to keep the original texture of the metal body.

For example, in the embodiment in which wiredrawing is performed to remove the carbon layer, after the metal is put into the vacuum chamber to obtain the carbon-nitrogen gradient hardening layer, the wiredrawing process can be carried out to remove the carbon layer, so as to keep the original texture of the metal body.

Figure 5:
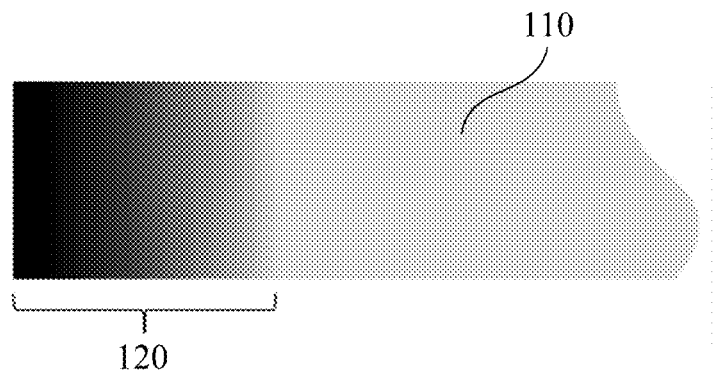
FIG. 5 is a schematic diagram of thickness direction of a metal assembly shown in FIG. 4.
Figure 6:
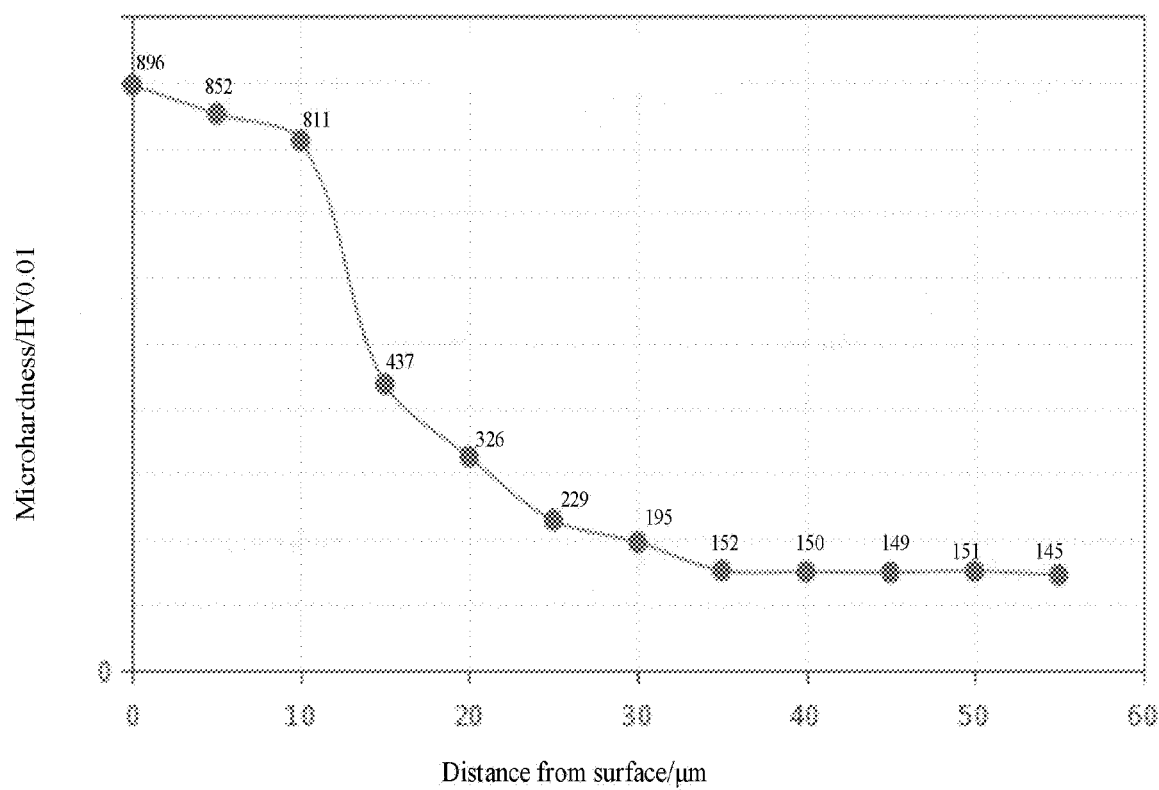
FIG. 6 shows the change in surface hardness of a metal assembly shown in FIG. 4.

As shown in FIG. 5 and FIG. 6, in an example of the disclosure, a metal assembly 100 is also provided. The metal assembly 100 includes a metal body 110 and a carbon-nitrogen gradient hardening layer 120 covering the metal body 100. A hardness of the carbon-nitrogen gradient hardening layer 120 is gradually reduced in a direction from its outer surface to its inside surface.

In the metal assembly 100, the hardness of the carbon-nitrogen gradient hardening layer 120 is gradually reduced in the direction from its outside surface to its inside surface, so that an inner layer of the carbon-nitrogen gradient hardening layer 120 has good adhesive force. Thus, the carbon-nitrogen gradient hardening layer 120 can be reliably attached to the metal body 110. Moreover, a surface layer of the carbon-nitrogen gradient hardening layer 120 has high hardness. With the help of the carbon-nitrogen gradient hardening layer 120, the hardness of the metal surface can be improved, so that the metal assembly 100 has better scratch resistance. The metal assembly 100 can reliably attach the carbon-nitrogen gradient hardening layer 120 on the surface layer of the metal body 110 to improve the scratch resistance.

In some examples, the carbon-nitrogen gradient hardening layer 120 can be obtained by using the metal surface layer treating method in any one of the above examples.

In some examples, a carbon-nitrogen ratio in the carbon-nitrogen gradient hardening layer is 15:1. In this way, the hardness of the carbon-nitrogen gradient hardening layer may further change in a regular gradient so that the inner layer close to the metal body has good adhesive force, while an outer layer farther away from the metal body has good scratch resistance.

In some examples, a thickness of the carbon-nitrogen gradient hardening layer is in the range of 3 μm to 35 μm and the carbon-nitrogen gradient hardening layer has a hardness of 896 HV0.01 to 852 HV0.01 at a distance of 0 to 5 μm from a surface of the carbon-nitrogen gradient hardening layer. In this way, the surface of the metal assembly may have a carbon-nitrogen gradient hardening layer with sufficient thickness to maintain the adhesive force of the carbon-nitrogen gradient hardening layer, obtain a surface with higher hardness, and give the metal body a higher scratch resistance.

Further, in some examples the carbon-nitrogen gradient hardening layer has a hardness of 811 HV0.01 to 437 HV0.01 at a distance of 10 μm to 15 μm from the surface of the carbon-nitrogen gradient hardening layer. In this way, the hardness of the carbon-nitrogen gradient hardening layer changes reasonably, so that the adhesive force also changes gradually, thereby reducing a risk of occurrence of a fracture phenomenon.

Further, in some examples, the carbon-nitrogen gradient hardening layer has a hardness of 326 HV0.01 to 229 HV0.01 at a distance of 20 μm to 25 μm from surface of the carbon-nitrogen gradient hardening layer. In this way, the adhesive force also changes gradually, reducing the risk of occurrence of the fracture phenomenon and preserving the integrity of the carbon-nitrogen gradient hardening layer.

In some examples, the carbon-nitrogen gradient hardening layer has a hardness of 195 HV0.01 to 152 HV0.01 at a distance of 30 μm to 35 μm from the surface of the carbon-nitrogen gradient hardening layer. In this way, the hardness of the carbon-nitrogen gradient hardening layer changes reasonably, the adhesive force also changes gradually, and the carbon-nitrogen gradient hardening layer has good adhesive force and is reliably fixed on the metal body.

In some examples, when the thickness of the carbon-nitrogen gradient hardening layer is 20 μm, the hardness of the carbon-nitrogen gradient hardening layer is in the range of 900 HV50gf to 1000 HV50gf. In this way, the carbon-nitrogen gradient hardening layer on the surface of the metal assembly may obtain the surface with higher hardness while maintaining the adhesive force, so that the metal body has higher scratch resistance.

Figure 4:
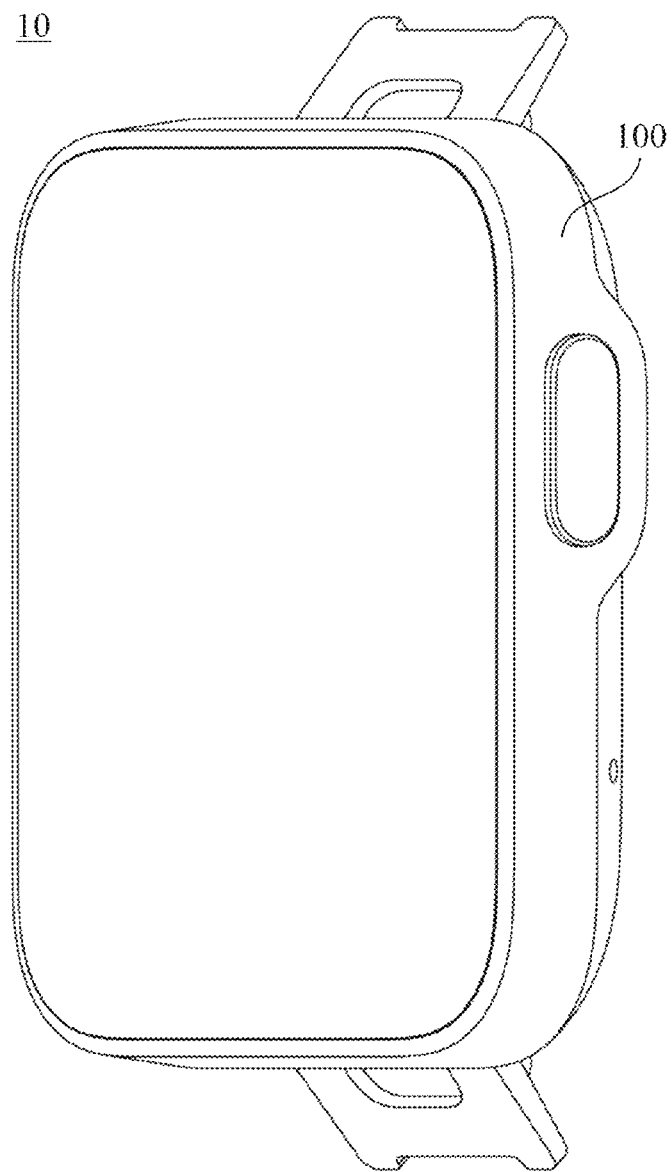
FIG. 4 is a schematic structural diagram of an electronic device shown in an example.

As shown in FIG. 4 and FIG. 5, in some examples, the metal assembly 100 includes a housing. At least part of the housing is ring-shaped. The outer side of the housing is provided with carbon-nitrogen gradient hardening layer 120. In this way, the inside of the housing can be used to fix the housing so that the housing may be put into a vacuum chamber for surface treatment. Through surface treatment, carbon-nitrogen gradient hardening layer 120 is formed on the surface of the housing, and thus the scratch resistance of the surface can be improved.

As shown in FIG. 4 to FIG. 6, in an example of the disclosure, an electronic device 10 is also provided. The electronic device includes a metal assembly 100. The metal assembly 100 includes a metal body 110 and a carbon-nitrogen gradient hardening layer 120 covering the metal body 110. A hardness of the carbon-nitrogen gradient hardening layer 120 is gradually reduced in a direction from an outside surface to an inside surface thereof. In this way, the hardness of the carbon-nitrogen gradient hardening layer 120 is gradually reduced in the direction from its outside surface to its inside surface. This provides an inner layer of the carbon-nitrogen gradient hardening layer 120 with a good adhesive force, and the carbon-nitrogen gradient hardening layer 120 can be reliably attached to the metal body 110.

Moreover, a surface layer of the carbon-nitrogen gradient hardening layer 120 has high hardness. With the help of the carbon-nitrogen gradient hardening layer 120, the hardness of the metal surface can be improved so that the metal has better scratch resistance. The metal assembly 100 can reliably attach the carbon-nitrogen gradient hardening layer 120 to the metal surface so as to improve the scratch resistance.

The electronic device 10 applies the above metal assembly 100 and utilizes the carbon-nitrogen gradient hardening layer 120 of the metal assembly 100 to form the surface. The metal assembly 100 has good adhesion performance and sufficient hardness on the surface. The metal assembly 100 can improve the scratch resistance of the electronic device 10 and is conductive to maintaining the aesthetic appearance of the electronic device 10. The electronic device 10 is preferred by consumers and is a more competitive product.

In some examples of the metal assembly of the electronic device 10, a carbon-nitrogen ratio in the carbon-nitrogen gradient hardening layer is 15:1. In some examples of the metal assembly of the electronic device 10, a thickness of the carbon-nitrogen gradient hardening layer is in the range of 3 μm to 35 μm. The carbon-nitrogen gradient hardening layer has a hardness of 896 HV0.01 to 852 HV0.01 at a distance of 0 to 5 μm from a surface of the carbon-nitrogen gradient hardening layer.

In some examples of the metal assembly of the electronic device 10, the carbon-nitrogen gradient hardening layer has a hardness of 811 HV0.01 to 437 HV0.01 at a distance of 10 μm to 15 μm from the surface of the carbon-nitrogen gradient hardening layer. In some examples of the metal assembly of the electronic device 10, the carbon-nitrogen gradient hardening layer has a hardness of 326 HV0.01 to 229 HV0.01 at a distance of 20 μm to 25 μm from the surface of the carbon-nitrogen gradient hardening layer.

In some examples of the metal assembly of the electronic device 10, the carbon-nitrogen gradient hardening layer has a hardness of 195 HV0.01 to 152 HV0.01 at a distance of 30 μm to 35 μm from the surface of the carbon-nitrogen gradient hardening layer. In some examples of the metal assembly of the electronic device 10, when the thickness of the carbon-nitrogen gradient hardening layer is 20 μm, the hardness of an outermost layer of the carbon-nitrogen gradient hardening layer 120 is in the range of 900 HV50gf to 1000 HV50gf.

In some examples of the metal assembly of the electronic device 10, the metal assembly 100 includes a housing. At least part of the housing is ring-shaped and the carbon-nitrogen gradient hardening layer 120 is disposed on an outer side of the housing. In addition, the inside of the housing can be used to protect electrical components within the housing. The carbon-nitrogen gradient hardening layer 120 in any one of the above examples is formed on the metal surface of the housing and has good adhesive force. At least part of the surface of the electronic device 10 has better scratch resistance. The carbon-nitrogen gradient hardening layer is conducive to maintaining the aesthetic appearance of electronic device 10.

Examples of electronic device 10 include a smart phone, a smart tablet PC, a smart eye, a smart watch, a smart bracelet PC, or other device using the above metal assembly 100. In some examples electronic device 10 is a smart watch and the metal assembly 100 is a watch case. In this way, the smart watch has good scratch resistance and the smart watch is not prone to scratching. The metal assembly is conductive to maintaining the aesthetic appearance of the smart watch. Such a smart watch is preferred by consumers and is a more competitive product.

Terms used in the present disclosure are merely for describing the specific examples herein and these are not intended to limit the present disclosure. The singular forms "one", "the", and "this" used in the present disclosure and the appended claims are also intended to include a multiple form, unless other meanings are clearly represented in the context. It should also be understood that the term "and/or" used in the present disclosure refers to any or all of possible combinations including one or more associated listed items.

Reference throughout this specification to "one embodiment," "an embodiment," "an example," "some embodiments," "some examples," or similar language means that a particular feature, structure, or characteristic described is included in at least one embodiment or example. Features, structures, elements, or characteristics described in connection with one or some embodiments are also applicable to other embodiments, unless expressly specified otherwise.

In the description of the disclosure, it should be understood that the orientation or positional relationship indicated by the terms "center", "longitudinal", "lateral", "length", "width", "thickness", "upper", "lower", "front", "back", "left", "right", "vertical", "horizontal", "top", "bottom", "inside", "outside", "clockwise", "counterclockwise", "axial", "radial", "circumferential", etc. is based on the orientation or positional relationship shown in the drawings, and is only for the convenience of describing the disclosure and simplifying the description, rather than indicating or implying that an indicated apparatus or element must have a specific orientation and be constructed and operate in a specific orientation, and therefore should not be construed as a limitation of the disclosure.

In addition, the terms "first", "second", etc. are only used for descriptive purposes, and should not be construed as indicating or implying relative importance or implicitly indicating the quantity of technical features indicated. Thus, a feature defined as "first", "second", etc. may expressly or implicitly include at least one of that feature. In the description of the disclosure, "a plurality of" means at least two, such as two, three, etc., unless expressly and specifically defined otherwise.

In the disclosure, unless otherwise expressly specified and limited, terms such as "installation", "connected", "connection", and "fixed" should be understood in a broad sense, for example, it may be a fixed connection or a detachable connection, or integrated; it may be a mechanical connection or an electrical connection; and it may be directly connected, or indirectly connected through an intermediate medium, or internal communication between two elements or the interaction between two elements, unless otherwise expressly specified. For those ordinarily skilled in the art, the specific meanings of the above terms in the disclosure may be understood according to specific situations.

In the disclosure, unless otherwise expressly specified and limited, a first feature being "on" or "under" a second feature may be the first and second features in direct contact, or the first and second features in indirect contact through an intermediate medium. Also, the first feature being "above", "over" and "on the upper face of" the second feature may mean that the first feature is right above or obliquely above the second feature, or simply mean that the level of the first feature is higher than that of the second feature. The first feature being "below", "under" and "on the lower face of" the second feature may mean that the first feature is right below or obliquely below the second feature, or simply mean that the level of the first feature is lower than that of the second feature.

It should be noted that when an element is referred to as being "fixed on", "disposed on", "fixedly disposed on" or "mounted on" another element, it may be directly on the other element or there may be a center element. When one element is referred to as being "connected" to another element, it may be directly connected to the other element or there may be a center element at the same time.

The various technical features of the above examples may be combined arbitrarily. In order to make the description concise, not all possible combinations of the various technical features in the above examples are described herein. However, as long as there is no contraindication in the combination of these technical features, combinations should be considered within the scope of this specification.

The above examples only express several example implementations of the disclosure. The descriptions are specific and detailed, but these details should not be interpreted as limitations on the scope of the disclosure. It should be noted that those ordinarily skilled in the art upon reading this disclosure will appreciate several modifications and improvements that could be made without departing from the scope of the disclosure, all of which are intended to remain within the protection scope of the disclosure.

Embodiments

1. A metal surface layer treating method is provided and includes the following steps: putting metal into a vacuum chamber, and vacuumizing the vacuum chamber to a first vacuum degree; adding a mixed gas of acetylene, nitrogen and hydrogen into the vacuum chamber; and elevating an ambient temperature in the vacuum chamber.

In response to the ambient temperature in the vacuum chamber reaching a first temperature value and a gas pressure of the vacuum chamber reaching a first pressure value, performing glow discharge so that a carbon-nitrogen gradient hardening layer is formed on a surface layer of the metal. The method includes removing part of a carbon layer of the surface layer of the carbon-nitrogen gradient hardening layer.

2. A metal surface layer treating method as described above is provided, wherein the first vacuum degree is in the range of 0.001 Pa to 10 Pa, the first temperature value is in the range of 400° C. to 450° C., the first pressure value is in the range of 100 Pa to 200 Pa, a voltage of the glow discharge is in the range of 600 V to 800 V, and a continuous discharge time is in the range of 35 h to 40 h.

3. A metal surface layer treating method of embodiments 1 or 2 above is provided, wherein in the mixed gas, the hydrogen accounts for 80% VOL to 90% VOL, the acetylene accounts for 5% VOL to 10% VOL, and the nitrogen accounts for 5% VOL to 10% VOL.

4. A metal surface layer treating method of any of embodiments 1 to 3 above is provided, wherein in the mixed gas, the hydrogen accounts for 80% VOL, the acetylene accounts for 10% VOL, and the nitrogen accounts for 10% VOL; alternatively, in the mixed gas, the hydrogen accounts for 90% VOL, the acetylene accounts for 5% VOL, and the nitrogen accounts for 5% VOL.

5. A metal surface layer treating method of any of embodiments 1 to 4 above is provided, wherein before putting the metal into the vacuum chamber, the method further comprises processing the metal into a ring-shaped housing, clamping the metal from an inside surface of the housing, and then putting the metal into the vacuum chamber.

6. A metal surface layer treating method of any of embodiments 1 to 5 is provided, wherein after processing the metal into the ring-shaped housing, the method further includes the following steps: performing surface treatment on the ring-shaped housing, and then putting the cleaned and dried metal into the vacuum chamber.

7. A metal surface layer treating method of any of embodiments 1 to 6 above is provided, wherein the metal is stainless steel and a thickness of a removed part of the carbon layer is 1 μm to 3 μm.

8. A metal assembly is provided. The metal assembly includes a metal body and a carbon-nitrogen gradient hardening layer covering the metal body. A hardness of the carbon-nitrogen gradient hardening layer is gradually reduced in a direction from a surface to an inside thereof.

9. A metal assembly of embodiment 8 above is provided, wherein a carbon-nitrogen ratio in the carbon-nitrogen gradient hardening layer is 15:1.

10. A metal assembly of embodiments 8 or 9 above is provided, wherein a thickness of the carbon-nitrogen gradient hardening layer is in the range of 3 μm to 35 μm; and the carbon-nitrogen gradient hardening layer has a hardness of 896 HV0.01 to 852 HV0.01 at a distance of 0 to 5 μm from a surface thereof.

11. A metal assembly of any of embodiments 8 to 10 above is provided, wherein the carbon-nitrogen gradient hardening layer has a hardness of 811 HV0.01 to 437 HV0.01 at a distance of 10 μm to 15 μm from the surface thereof.

12. A metal assembly of any of embodiments 8 to 11 is provided, wherein the carbon-nitrogen gradient hardening layer has a hardness of 326 HV0.01 to 229 HV0.01 at a distance of 20 μm to 25 μm from the surface thereof.

13. A metal assembly of any of embodiments 8 to 12 above is provided, wherein the carbon-nitrogen gradient hardening layer has a hardness of 195 HV0.01 to 152 HV0.01 at a distance of 30 μm to 35 μm from the surface thereof.

14. A metal assembly of any of embodiments 8 to 13 above is provided, wherein the carbon-nitrogen gradient hardening layer has a thickness of 20 μm and a hardness of an outermost layer of the carbon-nitrogen gradient hardening layer is in the range of 900 HV50gf to 1000 HV50gf.

15. A metal assembly of any of embodiments 8 to 14 above is provided, wherein the metal assembly includes a housing and the housing is at least partially ring-shaped and has the carbon-nitrogen gradient hardening layer described above on an outer side thereof.

16. An electronic device including a metal assembly is provided. The metal assembly comprises a metal body and a carbon-nitrogen gradient hardening layer covering the metal body. A hardness of the carbon-nitrogen gradient hardening layer is gradually reduced in a direction from a surface to an inside thereof.

17. An electronic device of embodiment 16 above is provided, wherein a carbon-nitrogen ratio in the carbon-nitrogen gradient hardening layer is 15:1.

18. An electronic device of embodiments 16 or 17 above is provided, wherein a thickness of the carbon-nitrogen gradient hardening layer is in the range of 3 μm to 35 μm and the carbon-nitrogen gradient hardening layer has a hardness of 896 HV0.01 to 852 HV0.01 at a distance of 0 to 5 μm from a surface thereof.

In another example, the carbon-nitrogen gradient hardening layer has a hardness of 811 HV0.01 to 437 HV0.01 at a distance of 10 μm to 15 μm from the surface thereof. In another example, the carbon-nitrogen gradient hardening layer has a hardness of 326 HV0.01 to 229 HV0.01 at a distance of 20 μm to 25 μm from the surface thereof. In another example the carbon-nitrogen gradient hardening layer has a hardness of 195 HV0.01 to 152 HV0.01 at a distance of 30 μm to 35 μm from the surface thereof.

19. An electronic device of any of embodiments 16 to 18 above is provided, wherein the carbon-nitrogen gradient hardening layer has a thickness of 20 μm and a hardness of an outermost layer of the carbon-nitrogen gradient hardening layer is in the range of 900 HV50gf to 1000 HV50gf.

20. An electronic device of any of embodiments 16 to 20 above is provided, wherein the metal assembly comprises a housing. The housing is at least partially ring-shaped and has the carbon-nitrogen gradient hardening layer described herein on an outer side thereof.

What is claimed is:

1. A metal assembly comprising:
   a metal body; and
   a carbon-nitrogen gradient hardening layer covering the metal body, wherein
      a hardness of the carbon-nitrogen gradient hardening layer is gradually reduced in a direction from an outside surface to an inside surface thereof,
      a thickness of the carbon-nitrogen gradient hardening layer is in the range of 3 μm to 35 μm, and
      the carbon-nitrogen gradient hardening layer has a hardness of 896 HV0.01 to 852 HV0.01 at a distance of 0 to 5 μm from a surface thereof.

2. The metal assembly according to claim 1, wherein a carbon-nitrogen ratio in the carbon-nitrogen gradient hardening layer is 15:1.

3. The metal assembly according to claim 1, wherein the carbon-nitrogen gradient hardening layer has a hardness of 811 HV0.01 to 437 HV0.01 at a distance of 10 μm to 15 μm from the surface thereof.

4. The metal assembly according to claim 3, wherein the carbon-nitrogen gradient hardening layer has a hardness of 326 HV0.01 to 229 HV0.01 at a distance of 20 μm to 25 μm from the surface thereof.

5. The metal assembly according to claim 4, wherein the carbon-nitrogen gradient hardening layer has a hardness of 195 HV0.01 to 152 HV0.01 at a distance of 30 μm to 35 μm from the surface thereof.

6. The metal assembly according to claim 1, wherein a thickness of the carbon-nitrogen gradient hardening layer is 20 μm, and a hardness of an outermost layer of the carbon-nitrogen gradient hardening layer is in the range of 900 HV50gf to 1000 HV50gf.

7. The metal assembly according to claim 1, further comprising:
   a housing which is at least partially ring-shaped and has the carbon-nitrogen gradient hardening layer on an outer side thereof.

8. A metal assembly comprising:
   a metal body; and
   a carbon-nitrogen gradient hardening layer covering the metal body, wherein
      a hardness of the carbon-nitrogen gradient hardening layer is gradually reduced in a direction from an outside surface to an inside surface thereof, and
      a carbon-nitrogen ratio in the carbon-nitrogen gradient hardening layer is 15:1.

* * * * *